United States Patent
Cheng et al.

(10) Patent No.: US 9,721,783 B2
(45) Date of Patent: Aug. 1, 2017

(54) METHODS FOR PARTICLE REDUCTION IN SEMICONDUCTOR PROCESSING

(75) Inventors: Tien-Chih Cheng, Hsin-Chu (TW); Hung-Wen Chang, Hsin-Chu (TW); Du-Cheng Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1510 days.

(21) Appl. No.: 13/371,185

(22) Filed: Feb. 10, 2012

(65) Prior Publication Data

US 2013/0210233 A1    Aug. 15, 2013

(51) Int. Cl.
*H01L 21/02* (2006.01)
*H01L 21/027* (2006.01)

(52) U.S. Cl.
CPC .... *H01L 21/0209* (2013.01); *H01L 21/02057* (2013.01); *H01L 21/0274* (2013.01); *H01L 21/02096* (2013.01); *H01L 21/02041* (2013.01)

(58) Field of Classification Search
CPC ............... H01L 21/0274; H01L 21/0209
See application file for complete search history.

(56) References Cited

U.S. PATENT DOCUMENTS

| | | | | |
|---|---|---|---|---|
| 5,671,119 A * | 9/1997 | Huang | ............... | B08B 1/00 361/234 |
| 5,811,184 A * | 9/1998 | Anderson | .......... | H05K 7/20181 206/701 |
| 5,882,956 A * | 3/1999 | Umehara | ............... | H01L 21/304 257/E21.237 |
| 5,902,678 A * | 5/1999 | Konda | .................. | B08B 7/0028 257/E21.224 |
| 6,136,137 A * | 10/2000 | Farnworth | ........... | B28D 5/0094 156/701 |
| 6,776,171 B2 * | 8/2004 | Carpenter | ............. | B08B 7/0014 134/1 |
| 2001/0042902 A1 * | 11/2001 | Wakabayashi | .......... | H01L 21/56 257/620 |
| 2003/0003724 A1 * | 1/2003 | Uchiyama | ........... | H01L 21/3081 438/667 |
| 2004/0050317 A1 * | 3/2004 | Klebanoff | ......... | H01L 21/67017 117/2 |

(Continued)

*Primary Examiner* — Mary Wilczewski
*Assistant Examiner* — Erik T Peterson
(74) *Attorney, Agent, or Firm* — Slater Matsil, LLP

(57) ABSTRACT

Methods for removing particles from a wafer for photolithography. A method is provided including providing a semiconductor wafer; attaching a polyimide layer to a backside of the semiconductor wafer; and performing an etch on an active surface of the semiconductor wafer; wherein particles that impinge on the backside during the etch are captured by the polyimide layer. In another method, includes attaching a layer of polyimide film to a backside of a semiconductor wafer; dry etching a material on an active surface of the semiconductor wafer; depositing of an additional layer of material on the active surface of the semiconductor wafer; removing the layer of polyimide film from the backside of the semiconductor wafer; patterning the layer of material using an immersion photolithography process to expose a photoresist on the active surface of the wafer; and repeating the attaching, dry etching, depositing, removing and patterning steps.

20 Claims, 8 Drawing Sheets

(56) References Cited

U.S. PATENT DOCUMENTS

| | | | |
|---|---|---|---|
| 2006/0021965 A1* | 2/2006 | Yang | B81C 1/00571 216/33 |
| 2006/0065910 A1* | 3/2006 | Ring | H01L 21/0445 257/192 |
| 2008/0026492 A1* | 1/2008 | Richter | H01L 21/02074 438/17 |
| 2008/0036985 A1* | 2/2008 | Clarke | G03B 27/42 355/53 |
| 2008/0173329 A1* | 7/2008 | Namikawa | H01L 21/6835 134/6 |
| 2009/0004780 A1* | 1/2009 | Arita | H01L 21/78 438/114 |
| 2010/0045145 A1* | 2/2010 | Tsuda | H03H 3/08 310/365 |
| 2010/0120230 A1* | 5/2010 | Grivna | H01L 21/78 438/464 |
| 2013/0020682 A1* | 1/2013 | Clark et al. | 257/616 |

* cited by examiner

METHODS FOR PARTICLE REDUCTION IN SEMICONDUCTOR PROCESSING

BACKGROUND

Size reduction of semiconductor devices has enabled continued improvement in speed, performance, density, and cost per unit function of integrated circuits and systems. As process nodes continue to shrink, critical dimensions ("CD") of the semiconductor devices have approached and even surpassed the theoretical limits of photolithography equipment. An approach to achieve finer resolution with photolithographic equipment is to use immersion photolithography. In immersion photolithography, a liquid such as purified water is interposed between the semiconductor substrate having photosensitive resist on it, and the final lens or patterning mask. By using a medium instead of air between the lens and the photoresist to be exposed, and in particular a medium having a refractive index greater than one, the achievable resolution may be increased. Immersion photolithography may increase resolution by as much as 30 percent over 'dry' processes.

As the feature sizes are reduced and the minimum feature sizes drop to 45, 32, 28 and lower nanometers, the sensitivity of the photolithographic process to unwanted particles increases. Particles have been observed in immersion photolithographic processes. These particles may become mobile in the immersion medium and can cause image defocusing during the photoresist exposure process, resulting in blurred lines in the exposed photoresist and corresponding defects in the patterned devices. Lowered yield and increased cost for finished devices may therefore result.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are illustrative examples but do not limit the scope of the disclosure and do not limit the scope of the appended claims. Embodiments of this disclosure include methods and apparatus for reducing or eliminating particles in the immersion photolithographic processes used at advanced semiconductor nodes. In particular, particles that have been observed on the backside of a wafer in conventional processes are reduced or eliminated by use of the embodiments. In embodiments, application of a polyimide layer such as a tape or film to the backside of the wafer. In some embodiments the polyimide film may be KAPTON®, a film provided by DuPont Inc. The polyimide film may include an adhesive layer; the film captures particles that impinge on the backside of a wafer in process. Prior to performing the next immersion photolithography step, this polyimide film may be removed, carrying the unwanted particles with it. By removing the film and unwanted particles from the wafer transport path, the particles are eliminated prior to performing the next photolithographic step. In this manner, the immersion photolithographic process may be performed without the particles from the backside of the wafer. Preventing these particles from contaminating the immersion liquid reduces or eliminates the defocus problems of the prior art photolithographic processes. Image lines remain sharp during resist exposure, and yields in the completed devices therefore improve, lowering costs, and preventing defects.

Although the embodiments are described with respect to illustrative examples in a specific context, namely immersion photolithography, etching, and deposition steps used in patterning of layers on semiconductor devices, the use of the embodiments may also be used to reduce particles in other semiconductor processes where particles might be disposed on the backside of a wafer in process, and the particles might, without use of the embodiments, subsequently interfere with additional processing steps. The embodiment methods and apparatus are not limited to the example processes described herein and the illustrative examples do not limit the appended claims.

Figure 1:
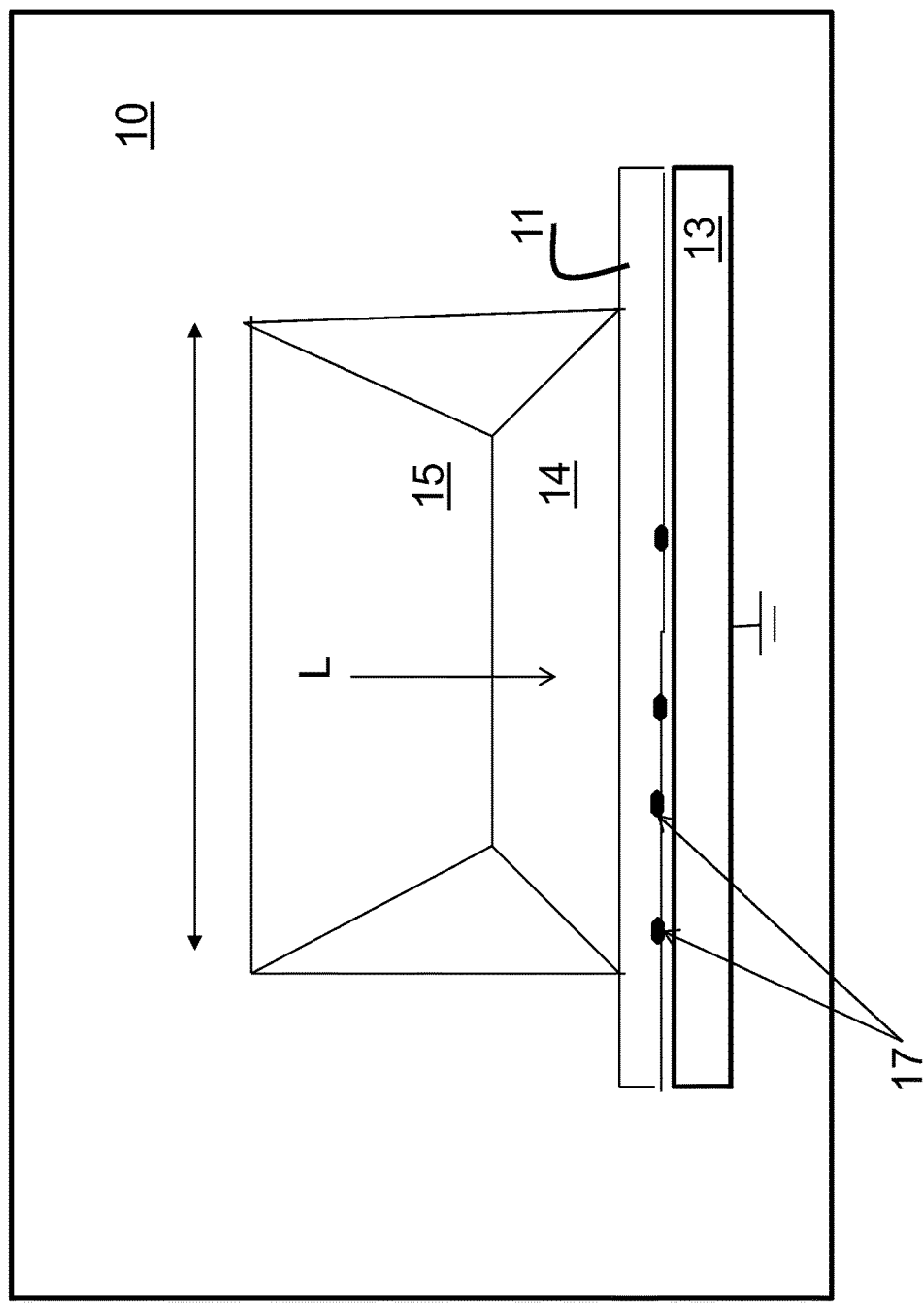
FIG. 1 depicts a cross-sectional view of a photolithography tool for use with the embodiments.

FIG. 1 depicts a cross-sectional view of selected features of a process and equipment for use with the embodiments. A process tool 10, which may be for example an immersion photolithography tool, is adapted to process a semiconductor wafer 11. A wafer chuck 13 supports wafer 11 and contacts it, at least in part, on the "backside" of the wafer; that is, the surface free from active devices. While the processes for forming devices are performed on the "active side" or the "front side" of the wafer 11, the backside is proximate to and in partial contact with the top surface of the chuck 13. Typically an electrostatic chuck or "ESC" carries the wafer and secures it. This wafer transport mechanism is often part of a tool or system and may be part of a robot arm or conveyor that moves the wafer from one process tool or chamber, to another, and thus the chuck 13 and wafer 11 move from tool to tool. The process tool 10 includes an immersion lithography head 15, which as shown in FIG. 1, travels across the surface of the wafer 11 in a scanning motion. Alternatively, the wafer may move while the immersion head is stationary, or both may move, but relative motion between the wafer surface and the scanning head is used. An immersion medium 14 is shown. This medium will have a refractive index greater than 1.0, the refractive index of air, to increase the numerical aperture of the lens system, the "NA", and thus allow for smaller CD sizes. An energy source, which may be a light or more typically an excimer laser, provides exposure energy "L". During processing in the immersion photolithography systems such as 10 in FIG. 1, light or energy is passed through a mask or reticle, and through a lens system in the photolithography head 15 and through medium 14, onto the surface of wafer 11, where a coating of photoresist has been deposited over a layer to be patterned. This photoresist may be positive or negative resist, but in any event a pattern is captured by exposing the resist.

The backside of the wafer 11 also is shown with particles 17. These particles can become mobile and interfere with the immersion photolithography by defocusing the light pattern during exposure of the resist. The number of these particles in conventional processes can become quite large. In experiments in a conventional advanced semiconductor process with a dry etch and using immersion photolithography, from 1200 to 2000 particles were detected that were larger than 1 um per wafer, in a system without the use of the embodiments. These numerous particles make successful production of semiconductor devices economically impractical, or impossible, due to the low yields obtained.

Figure 2:
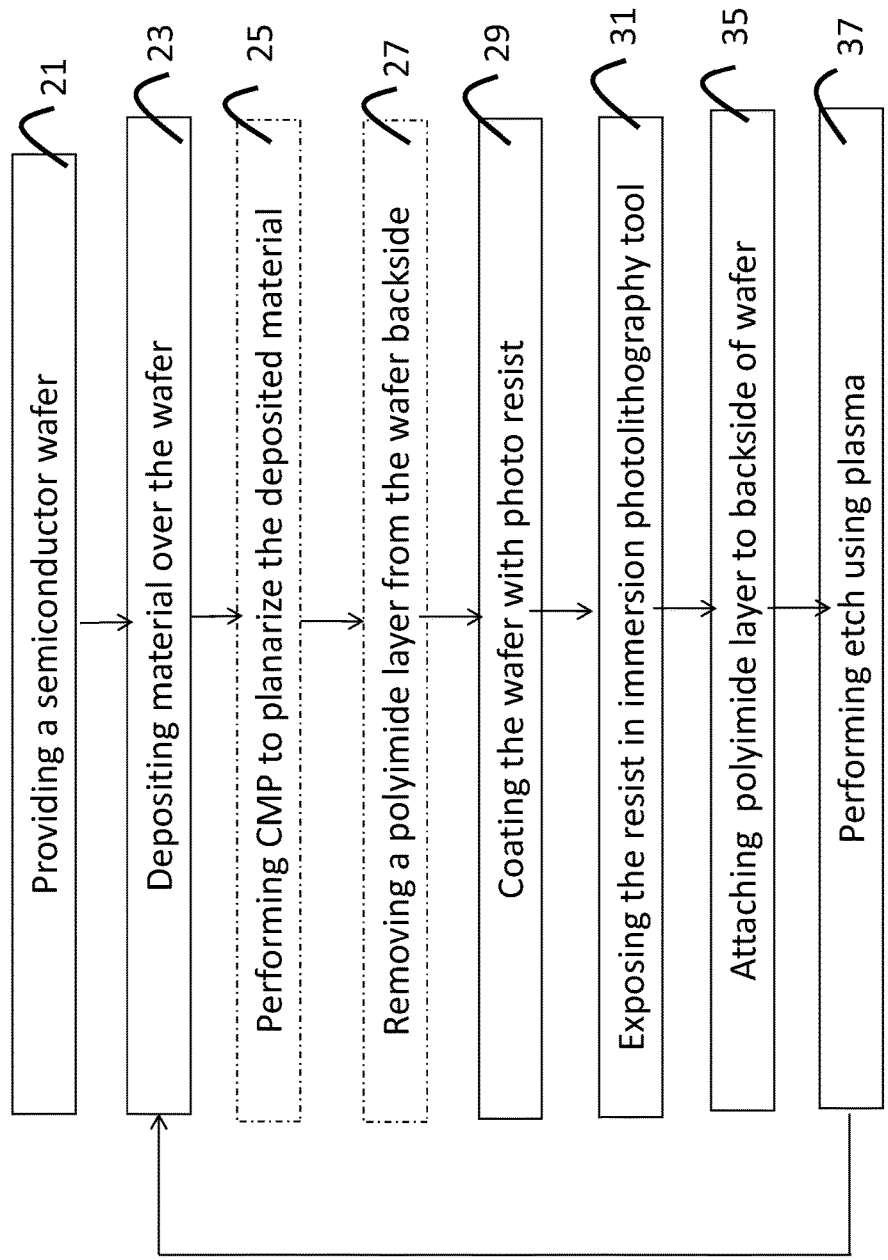
FIG. 2 depicts in a flow diagram a first method embodiment.

FIG. 2 depicts in a flow diagram a first embodiment method. A substrate such as a semiconductor wafer is provided for a series of processes at step 21. In step 23, a first deposit process is performed. For example, a dielectric layer such as interlevel dielectric or gate dielectric may be deposited over the wafer surface. Chemical vapor deposition (CVD) or plasma enhanced chemical vapor deposition (PECVD) may be used.

Step 25 depicts an optional but often performed step, which is to planarize the deposited layer using chemical mechanical polishing (CMP). This step may be omitted for some materials or process steps.

Step 27 is performed when a polyimide layer has been previously disposed on the backside of the wafer. The method of FIG. 2 is a loop or recursive process, and the first time through, step 27 is not needed, as the polyimide layer is not present on the backside of the wafer for the first pass through the loop. As will be described below, when the polyimide layer is present, it may have particles on it, and removing the polyimide layer also removes the particles prior to subsequent steps.

Step 29 prepares the substrate for photolithographic processing of the just deposited layer by coating the substrate with photoresist. Note that the removal of the polyimide layer from the backside, step 27, may occur before or after step 29, as alternative method embodiments.

In step 31, the wafer is transported to a photolithographic processing tool. As described above, this may be an immersion photolithographic system such as in FIG. 1. While the wafer is in the photolithographic tool, the photoresist is exposed for example using a scanning head and an immersion medium that travels over the surface of the wafer. Excimer laser or other irradiation or light energy may be used to expose the photoresist to form a pattern. After the resist is exposed, a resist stripping step may be used to remove portions of the resist to set up the pattern for the etch processes described later. Areas of the deposited layer from step 23 that are not protected by the resist may be etched, while those areas protected by the patterned resist will remain on the wafer.

In step 35, a layer of polyimide material is applied to the backside of the substrate. In an embodiment this layer may be a polyimide film or tape and may include an adhesive material such as silicon adhesive on one or both sides. The adhesive may be a removable or strippable adhesive, because the polyimide material will be removed in step 27. In one embodiment, KAPTON® film available from DuPont was used. The KAPTON film may be of a particular type VN, which is said to have superior dimensional stability, although this is not required. Polyimide film is used because in the subsequent plasma etching processes, polyimide film can endure the conditions, including the temperatures and chemicals, of the plasma etch tools and processes.

In FIG. 2, the next step is step 37, where the wafer is etched using a plasma process. For example, a dry etch process, such as reactive ion etch (RIE) may be used. During such an etch in a plasma tool, particles will be physically removed from the surface of the wafer by impinging the surface with chemically reactive ions, and these removed particles will then be moving within the plasma chamber. Some of these removed particles will impinge on the backside of the wafer, however, when this occurs, the polyimide film will capture these particles and hold them in place.

Following the etch process of step 37, the wafer (and wafer chuck) are transported back to the CVD tool at step 23. Another layer of material may then be deposited. As present semiconductor processes may include the deposition of many layers of dielectric, and/or conductors, overlying the substrate, the CVD, CMP, resist coating, resist photolithography, and RIE etching processes shown in FIG. 2 may be repeated a number of times. This is indicated by the loop arrow drawn in FIG. 2. After step 23 is performed again, the CMP step 25 may be performed. Next step 27 is performed, removing the polyimide layer from the backside of the semiconductor wafer. This removal step advantageously removes particles from the wafer that resulted on the backside during the RIE plasma etch or dry etch of step 37. The wafer is then transported to the coating step 29 and then to the immersion photolithography in step 31.

In contrast to the prior processes, when the wafer and chuck enter the photolithography process tool at step 31 using the embodiments, the wafer is free from backside particles that could come from prior performed etching steps. Thus the immersion photolithographic tool is not subject to the defocus and line blurring effects from these particles, as they have been removed in step 27 (along with the polyimide layer).

Figure 3:
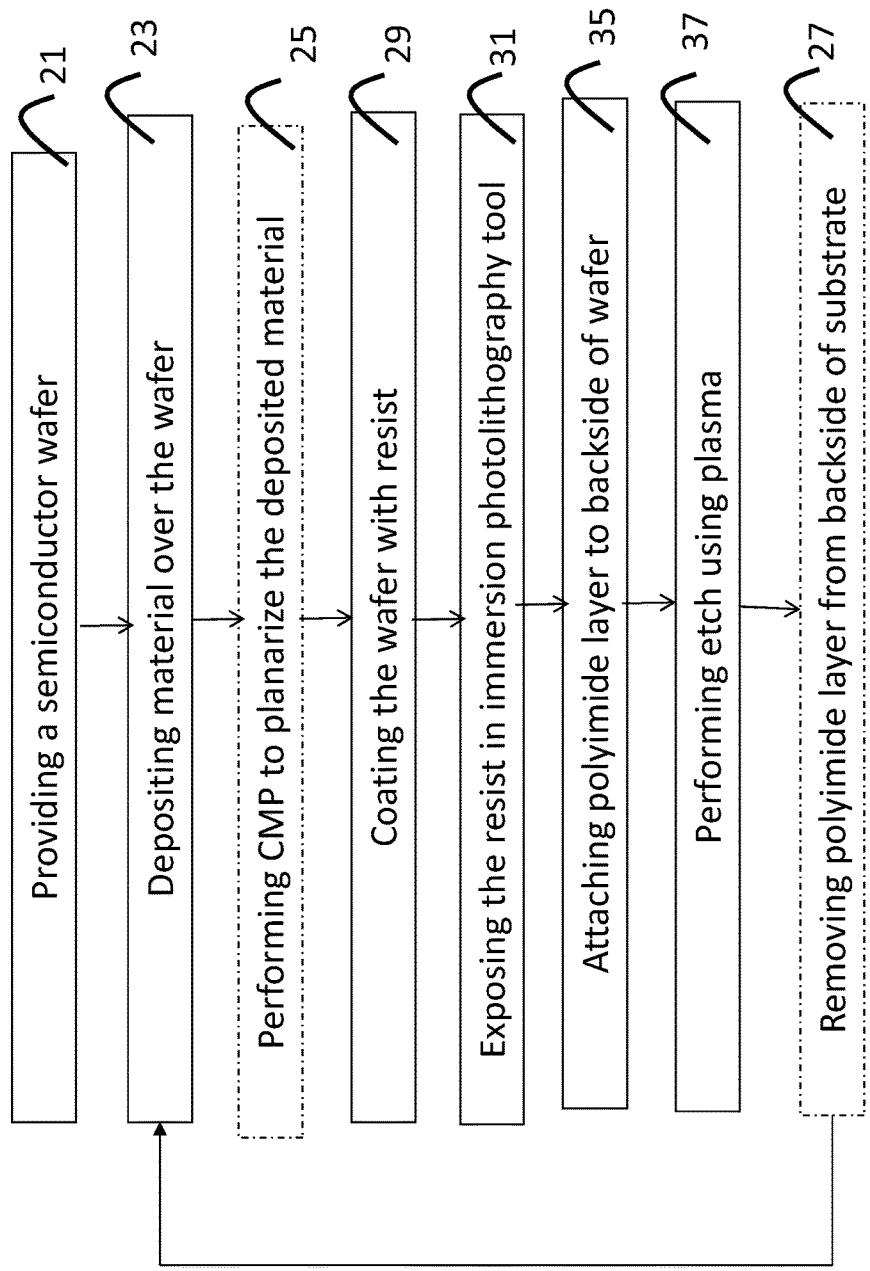
FIG. 3 depicts in a flow diagram a second method embodiment.

FIG. 3 depicts in another flow diagram an alternative method. In FIG. 3, the steps are the same as in FIG. 2 and thus like reference numerals are used. The order of steps is varied, however.

In FIG. 3, at step 21, the process begins with a semiconductor wafer on a chuck. In step 23 the wafer is transported to a deposition tool, or chamber, and a layer of material may be deposited. This may be, in example embodiments, a CVD or PECVD tool, although the embodiments and the claims appended hereto are not limited to these illustrative examples.

In step 25, an optional, but often performed step, CMP processing the deposited layer, is performed.

In step 29, the upper surface, the active side, of the wafer is coated with a photoresist.

In step 31, the photoresist is exposed and a pattern defined using an immersion photolithography tool as described above. The resist is exposed and unexposed areas may be removed by a developer or stripper.

In step 35, the polyimide layer is attached to the backside of the wafer. As described above this layer may be KAPTON®, for example. It may be a tape or film form, and may include an adhesive such as a silicone or acrylic adhesive. The film may be a commercially available film from about 1 to about 5 mils thick, although this is not necessary for the embodiments. Different formulations are available and these may have certain advantages, the use of these various types of polyimide films are contemplated as alternative embodiments.

In FIG. 3, the next step labeled 37 is performing the dry etch, an RIE etch in a plasma processing chamber may be used.

In FIG. 3, the next step is 27, removing the polyimide film from the backside of the wafer. Thus comparing the method in the flow diagram of FIG. 2 to that of FIG. 3, one can see that the order of steps is varied. The removal of the polyimide film (step 27) may occur at a number of places, so long as the particles and the polyimide film are removed from the backside of the wafer after the etch step and prior to the photolithography process in the immersion photolithography tool. The backside particles are removed from the wafer prior to the wafer being transported into the immersion photolithography tool. Depending on the particular tools and wafer transport mechanisms used, a convenient stage of the process can be selected for the polyimide film removal, and the embodiments are not limited to a particular order of steps. The particles from the dry etch process need to be removed by removing the polyimide from the backside of the wafer, at some point prior to the next immersion photolithography process. Then a new polyimide film is again applied to the backside of the wafer prior to the next RIE etch process so as to capture the particles again. The process is recursive and the film is removed, and attached, as the process repeats.

Figure 4:
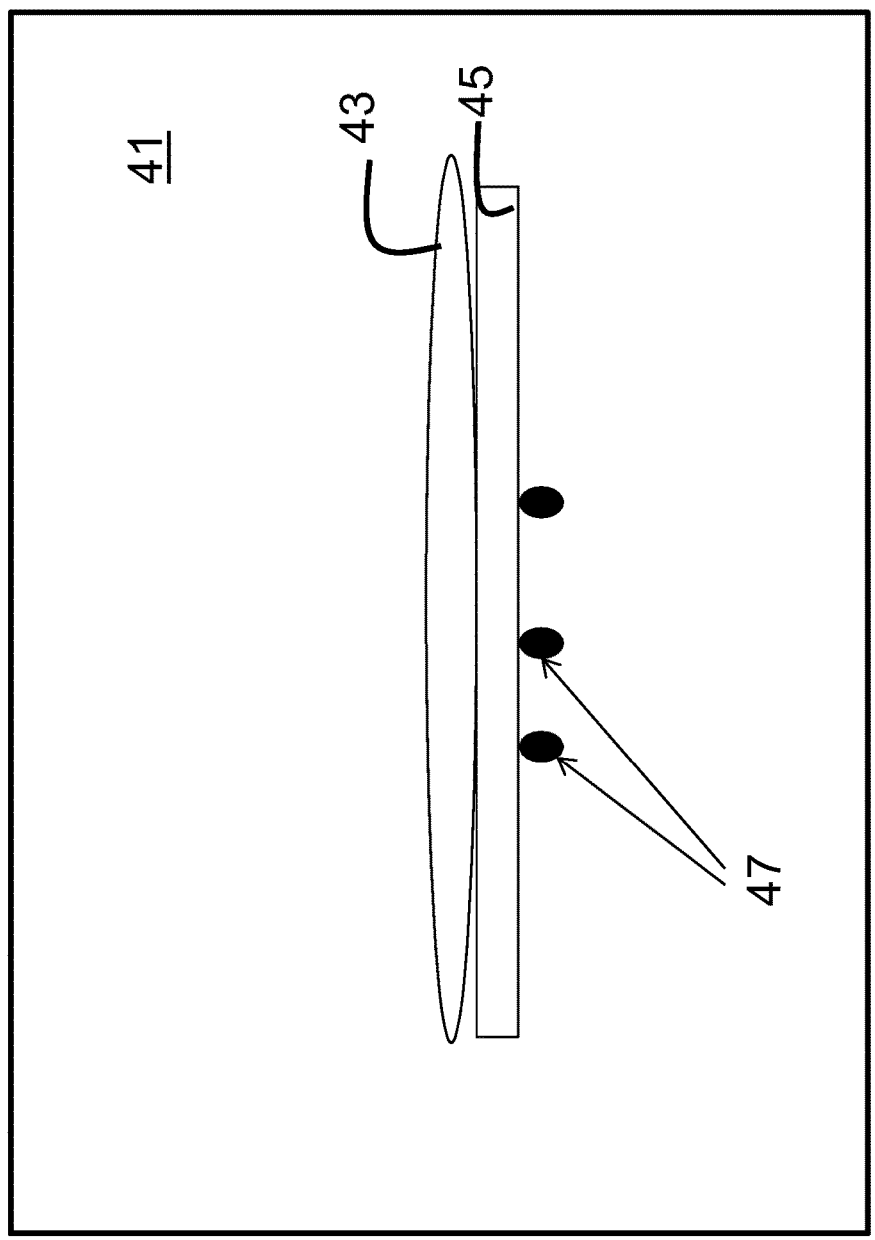
FIG. 4 depicts in a cross-sectional view an illustrative embodiment.

FIG. 4 depicts in cross section a process chamber, such as a wafer handling station, a CVD tool, or another process chamber 41 in use with an illustrative embodiment. In the tool 41 is a wafer 43 with a polyimide film 45 attached to the backside of the wafer. As shown, particles 47 are attached to the underside of the film 45 and are adhered to the film. This figure corresponds to steps 23, 25, in FIGS. 2 and 3 above, where the particles have been captured by the polyimide film.

Figure 5:
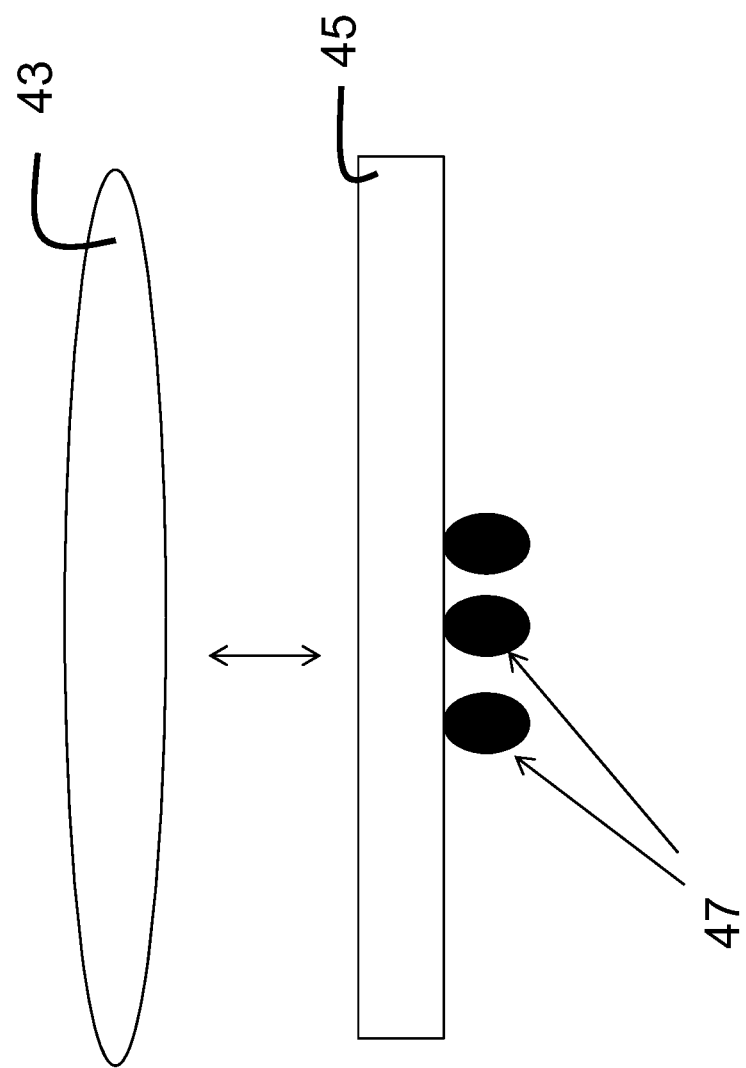
FIG. 5 depicts in a cross-sectional view a process step of an embodiment.

FIG. 5 depicts a step where the polyimide film 45 and particles 47 are removed from the backside of the wafer 43. This step corresponds to step 27 in FIGS. 2, and 3. The polyimide film of the embodiments advantageously carries the particles 47 away from the wafer with it, and when the film is removed, this process also removes the particles from the wafer transport path, so that contamination of subsequent processes is prevented.

Figure 6:
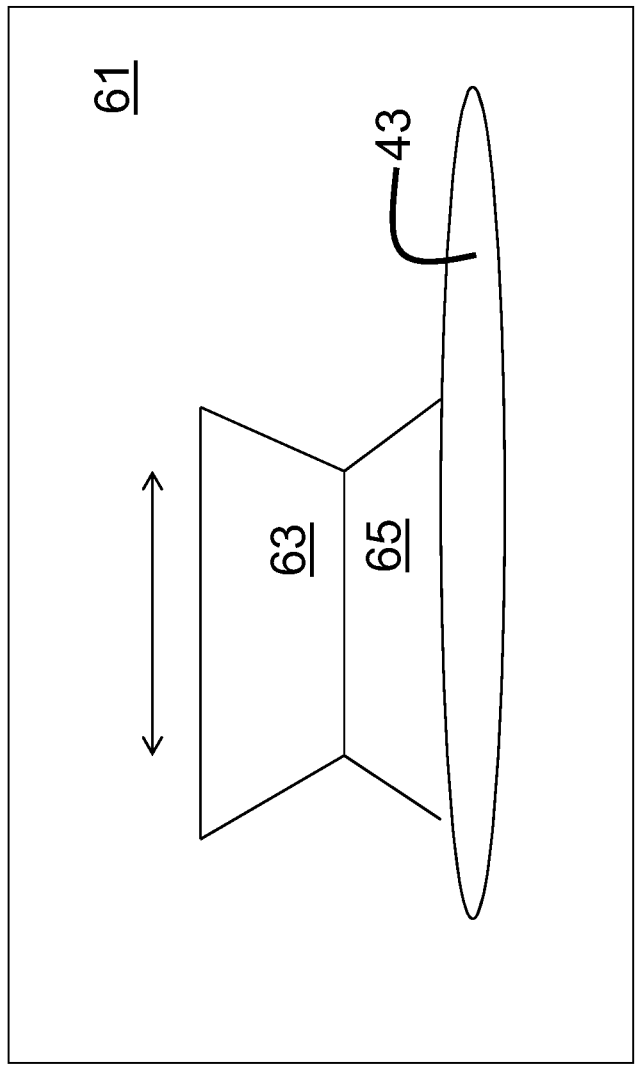
FIG. 6 depicts in a cross-sectional view another process step of an embodiment.

In FIG. 6, a photolithography tool 61 is shown in a cross sectional view. This photolithography tool 61 is also an immersion tool as shown by the head 63 and liquid medium 65 scanning across wafer 43. The operation shown in FIG. 6 corresponds to the exposure step 31 in FIGS. 2 and 3, for example. No particles are shown on the backside of the wafer 43 because the prior removal of the polyimide film in FIG. 5, for example, has also removed the particles.

Figure 7:
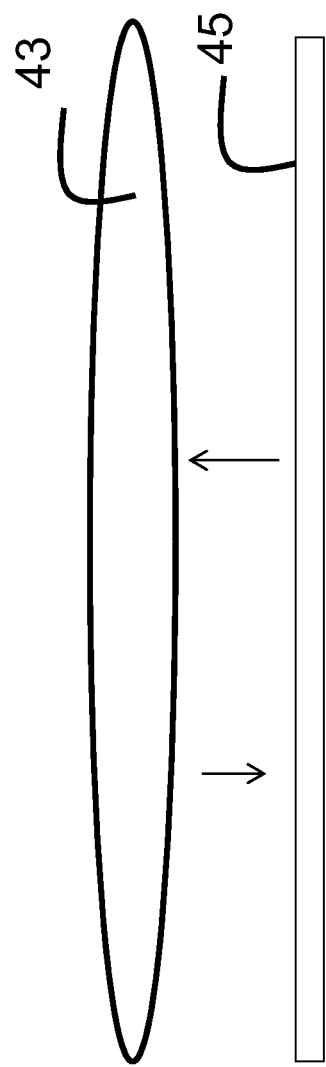
FIG. 7 depicts in a cross-sectional view yet another process step of an embodiment.

FIG. 7 depicts in a cross-sectional view the wafer 43 receiving polyimide film 45 on the backside. This process corresponds to step 35 in both FIGS. 2 and 3, for example. This step is done prior to the etch step 37, described above, so that the polyimide film 45 can capture any particles that would otherwise be disposed on the backside of wafer 43 and contaminate the wafer transport path, such as the surface of the electrostatic chuck adjacent to the backside of the wafer 45.

Figure 8:
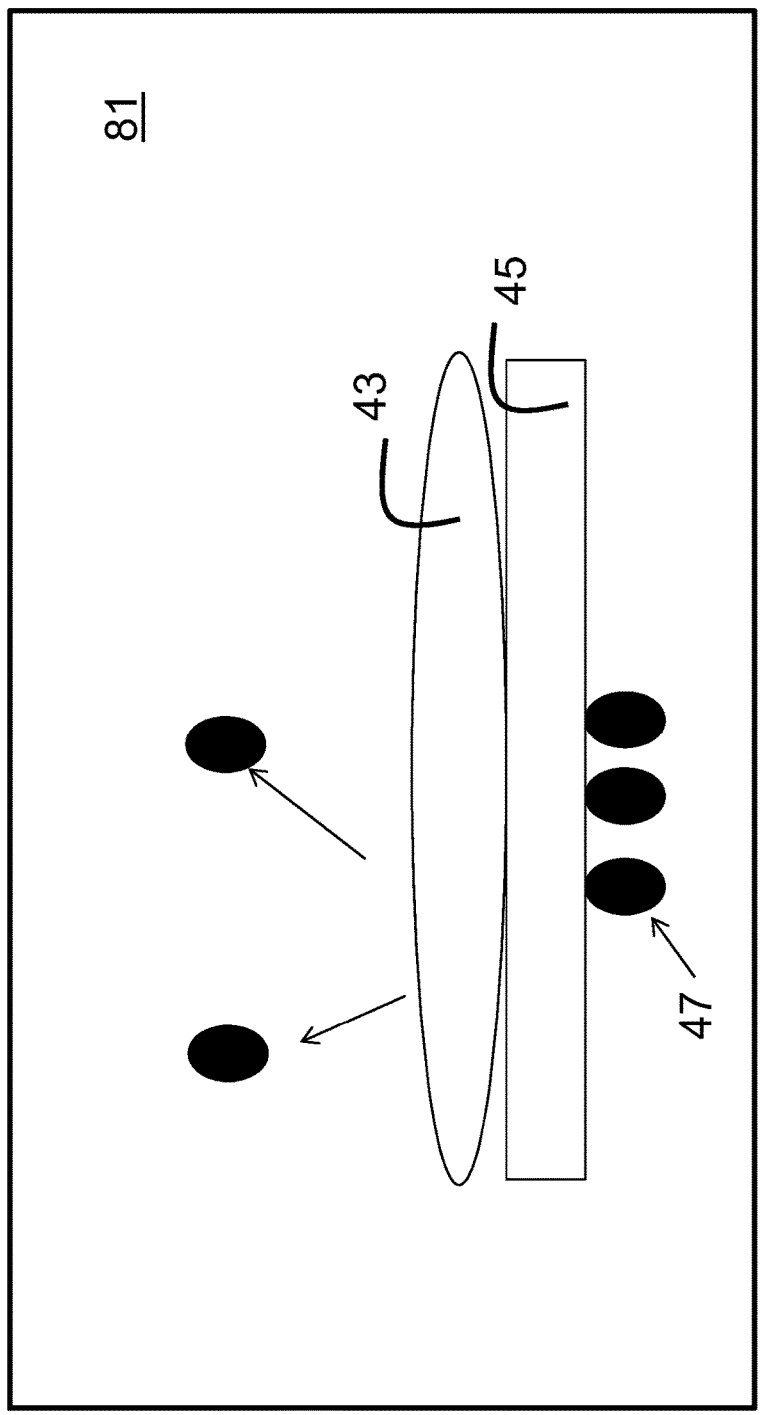
FIG. 8 depicts in a cross-sectional view another processing step of an embodiment.

FIG. 8 depicts in a cross-sectional view a dry etch chamber 81. Dry etch processes typical include the use of reactive ion etching (RIE) using active chemicals and applying plasma energy to impinge the reactive ions on the surface of the wafer 43. As material is removed, particles such as 47 will become mobile and move about the plasma chamber. As shown in FIG. 8, the polyimide film 45 will capture particles that impinge on the backside of the wafer 45. The tape will hold these particles until the polyimide film is removed. FIG. 8 corresponds to step 37 in FIGS. 2, and 3, above.

Use of the embodiments substantially reduces the particles detected on wafers in example processes. In experiments, the particles detected after the use of the embodiment polyimide film was less than 300 per wafer, as compared to between 1200 and 2000 per wafer observed without the use of the embodiments. Thus the use of the embodiments substantially reduces the particles that can interfere with immersion photolithography and make process yields unacceptable. Use of the embodiments requires no additional mask steps, and no added chemistry, and is economical and compatible with existing tools, processes and equipment.

In an embodiment, a method includes providing a semiconductor wafer; attaching a polyimide layer to a backside of the semiconductor wafer; and performing an etch on an active surface of the semiconductor wafer; wherein particles that impinge on the backside during the etch are captured by the polyimide layer. In a further embodiment, the method includes subsequent to etch, removing the polyimide layer from the backside of the semiconductor wafer.

In yet another embodiment, in the above methods, performing the etch includes performing a dry etch in a plasma chamber. In still another embodiment the methods include performing the dry etch by performing a reactive ion etch. In a further embodiment, the methods include performing a deposition over the active surface of the semiconductor wafer; removing the polyimide layer from the backside of the semiconductor wafer; and performing photolithography to pattern a material deposited in the deposition. In further embodiments, performing the photolithography comprises performing an immersion photolithography. In still additional embodiments attaching the polyimide layer includes attaching a polyimide layer that includes an adhesive. In further embodiments, attaching the polyimide layer comprises attaching a layer of KAPTON® film. In still additional embodiments attaching the polyimide layer includes attaching a layer of KAPTON® tape. In yet further embodiments, attaching the polyimide layer includes attaching a polyimide film that is between 1 and 5 mils in thickness.

In another embodiment, a method includes performing a deposition on a semiconductor wafer to deposit a layer of material; removing a first layer of polyimide film from a backside of the semiconductor wafer, the first layer of polyimide film capturing one or more particles that are greater than 1 micron; performing a photolithography process on the semiconductor wafer; attaching a second layer of polyimide film to the backside of the semiconductor wafer; dry etching the layer of material, wherein particles that impinge on the backside of the wafer during the dry etching are captured on the second layer of polyimide film; and repeating the steps of deposition, removing, performing photolithography, attaching, and dry etching.

In a further embodiment, a method includes attaching a layer of polyimide film to a backside of a semiconductor wafer; dry etching a material on an active surface of the semiconductor wafer, wherein one or more particles resulting from the dry etching are captured on the layer of polyimide film; depositing of an additional layer of material on the active surface of the semiconductor wafer; removing the layer of polyimide film from the backside of the semiconductor wafer; patterning the layer of material using an immersion photolithography process to expose a photoresist on the active surface of the wafer; and repeating the attaching, dry etching, depositing, removing and patterning steps. In yet another embodiment, the method includes removing of the layer of polyimide film from the backside of the wafer also removes at least one particle of greater than 1 micron. In still another embodiment, the method includes attaching a layer of polyimide film which includes attaching a layer of KAPTON® film.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method, comprising:
   attaching a polyimide layer to a backside of a semiconductor wafer;
   performing an etch on an active surface of the semiconductor wafer, wherein one or more particles impinge on the backside during the etch, and wherein the one or more particles are captured by the polyimide layer;
   performing a deposition process to form a material over the active surface of the semiconductor wafer; and
   performing a photolithography process to pattern the material; and
   before performing the photolithography process, removing the polyimide layer from the backside of the semiconductor wafer.

2. The method of claim 1, wherein performing the etch comprises performing a dry etch in a plasma chamber.

3. The method of claim 2, wherein performing the dry etch further comprises performing a reactive ion etch.

4. The method of claim 1, wherein performing the photolithography process comprises performing an immersion photolithography.

5. The method of claim 1, wherein attaching the polyimide layer comprises attaching a polyimide layer that includes an adhesive.

6. The method of claim 1, wherein attaching the polyimide layer comprises attaching a polyimide film having an adhesive layer provided therewith.

7. The method of claim 1, wherein attaching the polyimide layer comprises attaching a polyimide tape having an adhesive layer provided therewith.

8. The method of claim 1, wherein attaching the polyimide layer comprises attaching a polyimide film that is between 1 and 5 mils in thickness.

9. The method of claim 1, wherein the polyimide layer is removed after performing the etch.

10. The method of claim 1, wherein the polyimide layer is removed before performing the deposition process.

11. A method, comprising:
    attaching a first layer of polyimide film to a backside of a semiconductor wafer;
    performing a deposition on the semiconductor wafer to deposit a layer of material;
    removing the first layer of polyimide film from a backside of the semiconductor wafer, the first layer of polyimide film capturing one or more first particles that are greater than 1 micron;
    performing a photolithography process on the semiconductor wafer;
    attaching a second layer of polyimide film to the backside of the semiconductor wafer;
    dry etching the layer of material, wherein one or more second particles impinge on the backside of the semiconductor wafer during the dry etching, and wherein the one or more second particles are captured on the second layer of polyimide film;
    removing the second layer of polyimide film from the backside of the semiconductor wafer; and
    repeating the steps of attaching a first layer, deposition, removing the first layer, performing photolithography, attaching a second layer, and dry etching.

12. The method of claim 11, wherein performing the photolithography process further comprises performing immersion photolithography.

13. The method of claim 11, wherein performing the deposition comprises performing a chemical vapor deposition.

14. The method of claim 11, wherein attaching the second layer of polyimide film further comprises attaching a layer of polyimide film with an adhesive coating.

15. The method of claim 11, wherein attaching the second layer of polyimide film further comprises attaching a second polyimide film having an adhesive layer provided therewith.

16. The method of claim 11, wherein the step of removing a first layer of polyimide film from a backside of the semiconductor wafer occurs after the step of performing a photolithography process on the semiconductor wafer.

17. A method for reducing particles in an immersion photolithographic process for patterning layers on a semiconductor wafer, comprising:
    attaching a layer of polyimide film to a backside of the semiconductor wafer;
    dry etching a material on an active surface of the semiconductor wafer, wherein one or more particles resulting from the dry etching are captured on the layer of polyimide film;
    depositing of a layer of material on the active surface of the semiconductor wafer;
    removing the layer of polyimide film from the backside of the semiconductor wafer;
    patterning the layer of material using an immersion photolithography process to expose a photoresist on the active surface of the semiconductor wafer; and
    repeating the attaching, dry etching, depositing, removing and patterning steps.

18. The method of claim 17, wherein the removing of the layer of polyimide film from the backside of the semiconductor wafer also removes at least one particle of greater than 1 micron.

19. The method of claim 17, wherein attaching the layer of polyimide film comprises attaching a polyimide film having an adhesive layer provided therewith.

20. The method of claim 17, wherein attaching the layer of polyimide film comprises attaching an adhesively coated polyimide film.

\* \* \* \* \*